United States Patent
Row et al.

(10) Patent No.: US 8,548,091 B2
(45) Date of Patent: Oct. 1, 2013

(54) MEASURING AND CORRECTING ERRORS IN A TRANSMIT CHAIN WITH AN IQ UP-CONVERTER AND IQ DOWN-CONVERTER

(75) Inventors: Paul Row, Bishops Stortford (GB); Martin O'Flaherty, Bishops Stortford (GB); Graham Dolman, Ickleton (GB)

(73) Assignee: Apple Inc., Cupertino, CA (US)

( * ) Notice: Subject to any disclaimer, the term of this patent is extended or adjusted under 35 U.S.C. 154(b) by 1683 days.

(21) Appl. No.: 11/962,432

(22) Filed: Dec. 21, 2007

(65) Prior Publication Data

US 2010/0297966 A1 Nov. 25, 2010

(51) Int. Cl.
*H04B 1/04* (2006.01)
*H04K 1/02* (2006.01)
*H04L 25/03* (2006.01)
*H04L 25/49* (2006.01)

(52) U.S. Cl.
USPC .......................... 375/296; 375/297; 455/114.2

(58) Field of Classification Search
None
See application file for complete search history.

(56) References Cited

U.S. PATENT DOCUMENTS

| | | | | |
|---|---|---|---|---|
| 4,929,906 A | * | 5/1990 | Voyce et al. | 330/149 |
| 5,507,017 A | * | 4/1996 | Whitmarsh et al. | 455/126 |
| 5,793,817 A | * | 8/1998 | Wilson | 375/297 |
| 5,917,373 A | * | 6/1999 | Twitchell | 330/149 |
| 5,978,662 A | * | 11/1999 | Swales | 455/126 |
| 6,690,743 B1 | * | 2/2004 | Pellonpera | 375/296 |
| 7,339,903 B2 | | 3/2008 | O'Neill | |
| 2002/0021764 A1 | * | 2/2002 | Posti | 375/296 |
| 2002/0050372 A1 | * | 5/2002 | Lee | 174/35 R |
| 2002/0080891 A1 | * | 6/2002 | Ahn et al. | 375/297 |
| 2007/0182484 A1 | * | 8/2007 | Fonden et al. | 330/149 |
| 2008/0287077 A1 | * | 11/2008 | Grundlingh et al. | 455/126 |
| 2010/0135449 A1 | * | 6/2010 | Row et al. | 375/371 |

OTHER PUBLICATIONS

Official Action issued for Chinese Application No. 200880014733.3 on Apr. 17, 2012; 9 pages in Chinese Language (12 pages of English translation).

* cited by examiner

*Primary Examiner* — Khanh C Tran
*Assistant Examiner* — Gina McKie
(74) *Attorney, Agent, or Firm* — Meyertons, Hood, Kivlin, Kowert & Goetzel, P.C.

(57) ABSTRACT

A transmit chain comprises a transmit path with a quadrature up-converter which up-converts quadrature signal components to RF. An observation path samples a portion of the RF signal and a quadrature down-converter down-converts the RF signal to baseband quadrature signal components. A local oscillator signal source provides the up-converter and the down-converter with a local oscillator signal and is operable in two states. In a second of the states the local oscillator signal is applied to the up-converter and the down-converter and a phase shift is made to the signal applied to up-converter or the down-converter compared to the first of the states. A processor monitors properties of the down-converted signal while the local oscillator signal source is operating in the first state and the second state. The processor calculates a correction to apply to the baseband observation signal to correct for errors introduced by the observation path. The processor also calculates a correction to apply to the input signal to correct for errors introduced in the transmit path.

25 Claims, 7 Drawing Sheets

MEASURING AND CORRECTING ERRORS IN A TRANSMIT CHAIN WITH AN IQ UP-CONVERTER AND IQ DOWN-CONVERTER

FIELD OF THE INVENTION

This invention relates to linearization of systems in which an up-converter and a down-converter both have an IQ architecture. The invention is particularly useful in, but not limited to, the transmit chain of wireless communications devices.

BACKGROUND TO THE INVENTION

Wireless communication devices, such as base stations and terminals, have a transmit chain which includes a power amplifier to amplify a modulated signal to a high power level for transmission over a wireless channel. It is known that elements in the transmit chain can introduce distortion to the transmitted signal and therefore there have been various proposals to compensate for distortion. One such proposal is a pre-distortion architecture where a low power modulated signal is pre-distorted in a manner which will compensate for non-linear effects of a power amplifier, before being applied to the input of the power amplifier. The combination of the pre-distortion applied to the input signal, and the (inevitable) non-linear distortion applied to the input signal by the power amplifier, result in a substantially distortion-free output signal.

One type of adaptive pre-distortion architecture, described in U.S. Pat. No. 6,275,685, receives an RF input signal and applies pre-distortion to the RF input signal. The pre-distorted signal is then input to a power amplifier. A portion of the output (also at RF) is fed back to a comparator, which compares the input signal (before pre-distortion) and the output signal. The output of the comparator is used to modify the amount of pre-distortion.

Another type of adaptive pre-distortion architecture applies pre-distortion in the digital domain, before up-conversion to RF. Pre-distorted signals for In-phase (I) and Quadrature (Q) channels are digitally created at baseband, separately converted to analog, and then up-converted to RF by applying them to the I and Q branches of an IQ up-converter. A portion of the RF output signal is fed back to a comparison function to control the pre-distortion system. This feed-back path is known as an observation receiver, and can either down-convert a sampled portion of the RF output signal to an Intermediate Frequency (IF), or can down-convert a sampled portion of the RF output signal directly to baseband.

For the IF option, the sampled RF signal is converted to IF by mixing with a LO signal, and then a single ADC operating at a high sample rate samples the IF signal. The digital output of the ADC is then mixed with digital quadrature LO signals to generate digital baseband signals. As the mixing process is digital the resulting I and Q channels are very well matched and essentially it can be assumed that no IQ perturbations are added by the observation receiver. A disadvantage of this arrangement is that the ADC must operate at a very high sampling rate. Also, where the up-converter directly up-converts to RF, the LO required for the up-converter operates at a different frequency to the LO in the down-converter of the observation receiver and therefore requires an extra synthesizer and risks danger of spurious frequency generation.

An alternative option is to down-convert the RF signal to a baseband signal. The sampled RF signal is applied to the I and Q branches of a down-converter where it is mixed with a local oscillator signal and down-converted directly to baseband. The down-converted I and Q signals are separately converted to the digital domain by a pair of ADCs. This has the potential of reducing the cost of the observation receiver, as the ADCs can operate at a lower frequency and effective anti-alias filters are easier to achieve. However, an IQ down-converter (or up-converter) architecture can add their own impairments to the transmitted signal or observation signal. These impairments are due to differences in the I and Q paths, and can arise in a mixer, anti-alias filter or ADC parts of the down-converter. This has inhibited the use, and effectiveness, of an IQ ADC architecture in the observation receiver path. An IQ up-converter will typically add dc, gain offset and angle offset impairments resulting in LO leakage and quadrature images in the RF spectrum. Methods to correct for these up-converter imperfections are known but rely on no additional quadrature impairments being added in the measurement system used to correct them. If the observation receiver uses an IQ architecture then this is not the case. Even once the IQ errors in the up-converter are compensated for, the errors in the down-converter impair the observation signal used to control the RF amplifier predistortion and limit the effectiveness of the amplifier predistortion correction loop. Accordingly, it is necessary to correct for errors introduced by the up-converter and down-converter.

The present invention seeks to provide a method to correct the quadrature impairments of a transmit chain having an IQ architecture in both the up-converter and the observation receiver.

SUMMARY OF THE INVENTION

A first aspect of the present invention provides a transmit chain according to claim 1.

Another aspect of the invention provides a processor for use in a transmit chain according to claim 18.

A further aspect of the invention provides a method of correcting signal errors in a transmit chain according to claim 19.

By periodically changing the LO phase, the impairments due to the up-converter will appear to rotate (in phase space) whilst down-converter impairments do not rotate. This allows the two sets of impairments to be distinguished. Any IQ impairments introduced by the up-converter can be identified, and compensated for, separately from any impairments introduced by the down-converter of the observation receiver.

Because signal impairments introduced by the transmit path and the observation receiver can be separately identified, and corrected for, it is possible to use an IQ architecture in the observation receiver and thereby avoid the need for very high speed, wide bandwidth components of an IF observation receiver. Since both transmit path and observation path now use the same LO frequency, one less frequency synthesizer is required, which reduces cost and also helps to reduce spurious interference between the different LO frequencies.

The phase shift can be selectively switched between two convenient phase values, such as 0 and 90 degrees. Analysis of the observed signal for both phase states allow the quadrature errors introduced by each of the down-converter and up-converter to be separately identified and corrected for. The different phase states could be applied to the LO signal applied to the up-converter or the down-converter, but it is preferable to apply the phase shift only to the down-converter, since this avoids introducing further impairments to the transmitted signal. Advantageously, the phase shift between the two states of the local oscillator signal applied to the down-converter is set at a value of 90°, as this simplifies the process of determining when impairments have been minimized and helps to simplify the computation of correction parameters. However, the invention is not limited to a phase shift of 90°, and any other suitable value can be used.

Advantageously, the up-converter converts directly between baseband and RF. However, the invention can also be used in architectures with two stages of up-conversion, i.e. IQ->IF->RF and equivalent stages of down-conversion in the observation path.

The processor can use various possible algorithms, alternating attempts to correct up-converter and down-converter based on either/or knowledge of the transmitted signal (a priori) or no knowledge (blind) analysis of the down-converter output.

The invention is particularly suitable for a predistortion Power Amplifier (PA) architecture where the transmit path includes a Power Amplifier and pre-distortion is applied to an input signal to compensate for errors introduced by the Power Amplifier.

The observation path can be shared between a plurality of different transmitters or transmit paths on a time-shared basis.

The functionality of the processor described here can be implemented in software, hardware or a combination of these. The invention can be implemented by any suitable processing apparatus, such as a general-purpose processor or computer executing software to implement the functionality, a logic array or similar apparatus which has been configured to perform the functionality, or dedicated processing hardware, such as an Application Specific Integrated Circuit (ASIC). Accordingly, another aspect of the invention provides software for implementing any of the methods.

The software may be stored on an electronic memory device, hard disk, optical disk or other machine-readable storage medium. The software may be delivered as a computer program product on a machine-readable carrier or it may be downloaded to a processor via a network connection.

The transmit path can be used in any system generating a quadrature modulated signal. It has application in wireless systems, such as wireless base stations or wireless terminals. The wireless system can include cellular, broadcast, satellite uplink and microwave systems. It also has application in cabled transmission systems.

BRIEF DESCRIPTION OF THE DRAWINGS

Embodiments of the invention will be described, by way of example only, with reference to the accompanying drawings in which.

DESCRIPTION OF PREFERRED EMBODIMENTS

Figure 1:
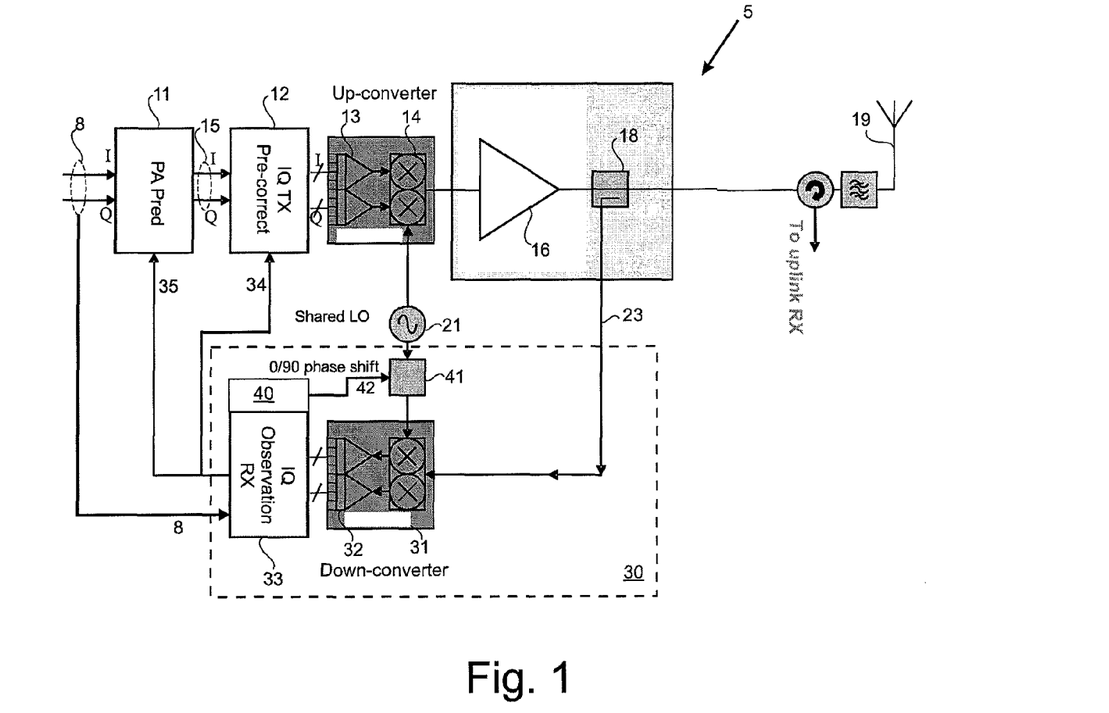
FIG. 1 shows a transmit chain of a wireless device which includes a power amplifier and pre-distortion system in accordance with an embodiment of the present invention.

FIG. 1 shows a first embodiment of a pre-distortion system 5 which can be used as part of the transmit chain of a wireless base station. An input signal 8 is received at an input of a predistortion module 11. The transmit chain uses a quadrature modulation scheme, such as Quadrature Amplitude Modulation (QAM) or Quadrature Phase Shift Keying (QPSK). Accordingly, the input signal 8 representing a digital signal intended for transmission has in-phase (I) and quadrature (Q) components which can subsequently be used to modulate in-phase and quadrature components of a carrier signal. PA Pre-distortion module 11 applies, in the digital domain, pre-distortion to the signal 8 to compensate for expected non-linearities that will be introduced by the power amplifier 16. The pre-distorted signal is applied to an IQ pre-correction module 12 which applies, in the digital domain, a correction to the signal to compensate for expected IQ errors that will be introduced by the up-conversion stage 14 and DACs 13. The pre-distorted signal is then applied to a digital-to-analog conversion stage (DAC) 13. There are two DACs 13, one for each of the I and Q components. These convert each of the I and Q components from digital form to analog form. An up-conversion stage 14 receives a local oscillator signal from source 21 and using in-phase and quadrature (90° phase shifted) version of the carrier signal modulates the analog I and Q signal components. In this embodiment, the upconverter stage 14 directly generates an RF signal, with local oscillator supplying an RF carrier signal. The modulated in-phase and quadrature components are combined and the combined RF signal is then amplified by a power amplifier 16. It will be appreciated that the local oscillator can be set to any desired frequency, depending on the frequency of the RF channel at which the signal needs to be transmitted. The transmit chain may also comprise other additional signal processing stages such as filters, attenuators, additional gain stages.

A portion 23 of the RF output is sampled by a splitter 18 and fed to an observation receiver chain 30. The sampled portion of the RF signal 23 is applied to a down-conversion stage 31. The sampled portion of the signal is split into two branches (in-phase and quadrature) and each branch includes a mixer which mixes the signal with a carrier signal derived from local oscillator 21. In a known manner, the input to one mixer is offset from the other by 90°. Each of the demodulated in-phase and quadrature signal components are separately converted to the digital domain by ADC stage 32 and applied to an observation receiver 33. The observation receiver 33 monitors the signal it receives via the feed-back path 30 and determines settings 34 for the IQ TX pre-correction module 12 which corrects signal impairments introduced by the upconverter 14. The observation receiver 33 also compares the signal it receives via the feed-back path 30, and the input signal 8, and determines settings 35 for the PA predistortion module 11. The observation receiver chain may also comprise other additional signal processing stages such as filters, attenuators, additional gain stages.

Performance of the PA pre-distortion system relies on the quality of the signal received at the observation receiver 33. IQ errors introduced in either transmit chain or observation receiver chain will reduce performance of PA predistortion loop if not corrected. It is necessary to separately identify what errors are introduced by the transmit chain, and what errors are introduced by the observation receiver chain 30.

The local oscillator signal from source 21 is applied both to the modulation stage 14 and the demodulation stage 31. A phase shift of 0 or 90° is selectively applied by a module 41 in the path to the observation receive path 30. For the avoidance of doubt, the phase shift that is selectively applied by module 41 is in addition to the conventional 90° phase shift between in-phase and quadrature branches. Changing the phase shift between the two phase values allows the errors of the transmit chain and observation receiver chain to be separately identified. A controller 40 issues a control signal 42 to the phase shift module 41 and monitors the signal received by the observation receiver at each of the phase values.

One way of considering the impairments of an IQ up-converter or down-converter is as a three parameter model:
- a dc offset described as a complex variable indicating separate dc offset on I and Q;
- a gain offset, representing a different gain in the I and Q paths;
- an angle offset to compensate for the LO split to the two mixers of an IQ down-converter not being precisely 90°. For mathematical convenience it is often assumed that both axes move by ($\phi/2$) relative to the ideal rather than one axis moving by $\phi$.

Figure 2:
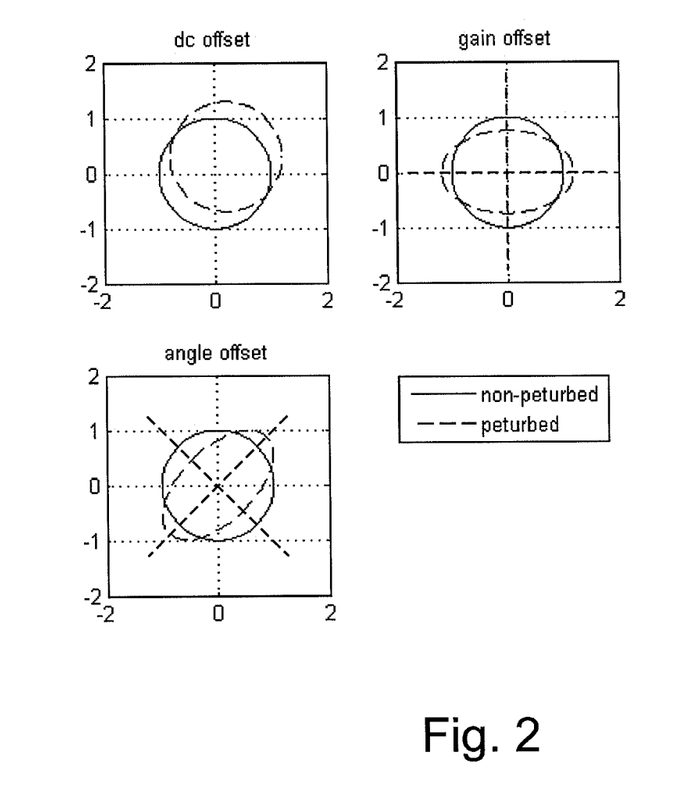
FIGS. 2 and 3 show signal impairments that can arise in the system of FIG. 1.
Figure 3:
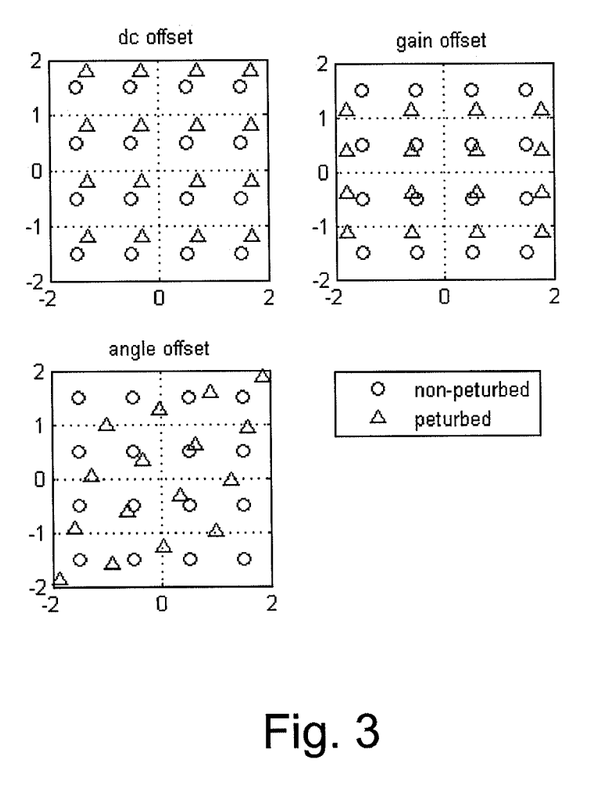

FIG. 2 shows the effect of each type of impairment on a circular signal constellation. An uncorrupted signal is shown as a perfect circle. The effect of a DC offset is simply to offset the constellation; the offset can be in just the I direction, the Q direction, or both I and Q directions, as shown in this example. The effect of a gain offset is to transform the circle into an ellipse with the major/minor axes along the IQ axes (shown as dashed lines). The effect of an angle offset is also to transform the circle to an ellipse, but this time with minor and major axes at +/−45 degrees relative to the IQ axes (shown as dashed lines). Angle offset is considered as a movement of both axes by ($\phi/2$; the results are slightly different if considered as movement of one axis by $\phi$). The effect of an angle offset is similar to that of a gain offset except that the angle of the major/minor axes of the ellipse rotate by 45 degrees. Mathematically, angle offset can be considered as a rotation by 45 degrees, followed by a gain offset, followed by a rotation of −45 degrees. FIG. 3 shows the effects of the same perturbations when applied to a QAM16 constellation.

Figure 4:
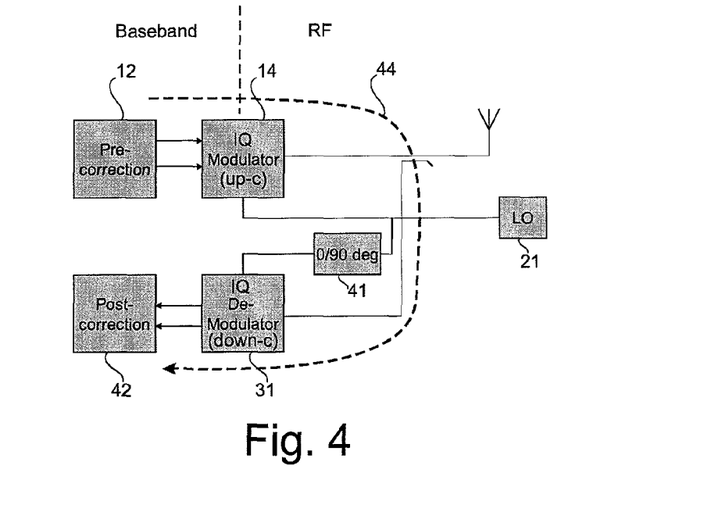
FIG. 4 shows a simplified form of FIG. 1, illustrating a signal path between a signal input and an observation receiver.

FIG. 4 shows a simplified form of FIG. 1, illustrating the signal path 44 experienced by an input signal which is coupled to the observation path receiver. Signal 8, applied to the transmit chain, will firstly pass through up-converter 14, where it will be subjected to any impairments of the up-converter 14, before being sampled at coupler 18 and passing through down-converter 31, where it will then be subjected to any impairments of the down-converter. Finally, the signal arrives at the observation receiver/post-correction block 42. A changeable phase shift to the local oscillator signal applied to the down-converter 31 allows for the IQ imperfections of the up-converter/up-converter 14 and the down-converter 31 to be separately identified and corrected.

In order to drive a correction process, it is necessary to measure some metrics indicative of an amount of error. Measurements should be made over a measurement period which is long enough to average out short-term effects. There is a trade-off between the period over which an error estimate is made and the gain of the correction loop. An error loop will typically update the correction parameter on a periodic basis by adding a fraction of the estimated residual error to the current error estimate. An error estimate made over a long period already includes a high degree of averaging and the fraction used could be close to 1. An error estimate made over a shorter period is likely to be less accurate and a fraction much less than 1 should be used. The integration loop provides additional filtering in this case. The effect of less frequent more updates and frequent lower accuracy updates, with different loop gains should be similar. The following metrics will be described in detail: dc mean; first order expansion; phase rotation.

DC Mean

Long term signal dc mean (complex) is measured over a period comprising many cycles of a modulated carrier wave.

I,Q Rms and Cross-correlation Values

Consider the data file captured from the quadrature down-converter 31, consisting of n samples each of the form a+ib. Express the data file as a matrix as follows:

$$X = \begin{bmatrix} a_0 & a_n \\ b_0 & b_n \end{bmatrix}$$

$$X^T = \begin{bmatrix} a_0 & b_0 \\ a_n & b_n \end{bmatrix}$$

And $$Y = XX^T = \begin{bmatrix} \sum_i a_i^2 & \sum_i a_i b_i \\ \sum_i a_i b_i & \sum_i b_i^2 \end{bmatrix}$$

The components of Y ($XX^T$) relate to the powers and cross-correlation of the real and imaginary parts of the captured signal. These quantities are required to determine the different signal impairments.

The matrix Y can be accumulated as the signal is captured and it is not necessary to store the entire signal for later processing. For an ideal signal with no quadrature impairment, Y(1,1) and Y(2,2) have equal values and both Y(1,2) and Y(2,1) are zero. The matrix Y can therefore be used as an error metric to drive revised correction estimates. A matrix Y ($XX^T$), is stored for each of the phase states of the LO. Matrix Y can be computed as each element of X captured, avoiding the need to store X in entirety.

Phase Rotation

Figure 5:
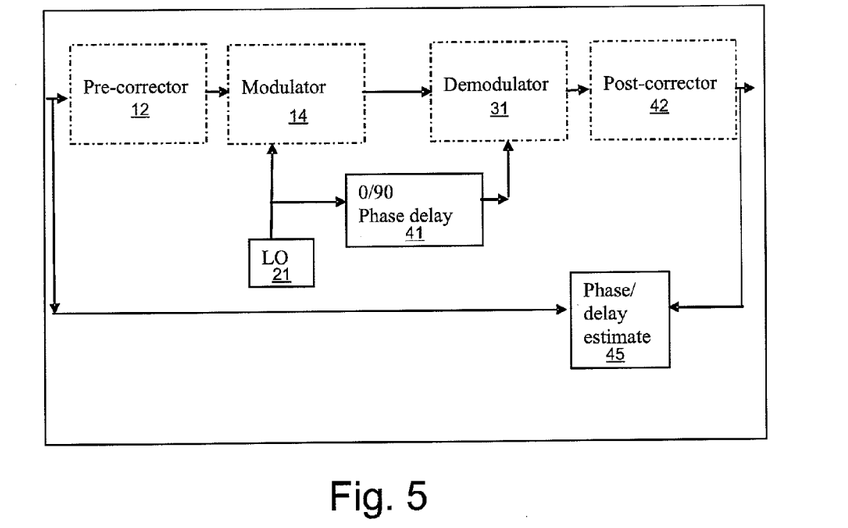
FIG. 5 shows measurement of phase delay along the path shown in FIG. 4.

In any practical implementation signal processing elements (amplifiers, filters, attenuators etc.) in the up-converter chain between the output of the up-converter 14 and the antenna 19, and in the observation receiver chain from coupler 18 to down-converter 31, will each have a phase shift across them. An unknown (but constant) phase relationship also exists between the up-converter LO input and the 0/90° down-converter selector. Therefore, an arbitrary phase shift exists. This will add some phase rotation between the up-converter IQ system and the down-converter IQ system. In order to apply pre-correction to correct the up-converter, the measurements, as seen at the down-converter output, should be corrected to allow for the phase rotation. The size of the phase rotations has to be estimated, several approaches are possible:

trial/error: select a first phase shift value by some means, such as guessing, estimating or selecting a stored initial value; apply a pre-correction based on that first phase shift; determine if the pre-correction improves or worsens the performance and modify the value of the phase shift.

apply a deliberate impairment or an additional component to the transmitted signal and detect this at the down-converter. If the original impairment is known, it should be possible to make a reasonable estimate of phase shift.

transmitted signal and observed signal are both known, allowing a time delay/phase correlation to be made. The phase rotation can be estimated by comparing the input signal to the up-converter 14 with the output signal from the down-converter 31. The two signals are time adjusted and the phase can then be calculated, as illustrated by module 45 in FIG. 5.

Methods will now be described of correcting for signal impairments identified by the error metrics. The three main forms of correction are: dc correction; gain correction; angle correction.

DC Correction

In a system comprising a single IQ down-converter, the removal of DC offset terms is achieved by simply averaging the mean of the received signal over a suitably long period (the dc offset estimate) and subtracting this value from future samples. Further estimates of any residual dc on the corrected signal stream may be accumulated to provide an improved estimate of the dc offset.

Figure 6:
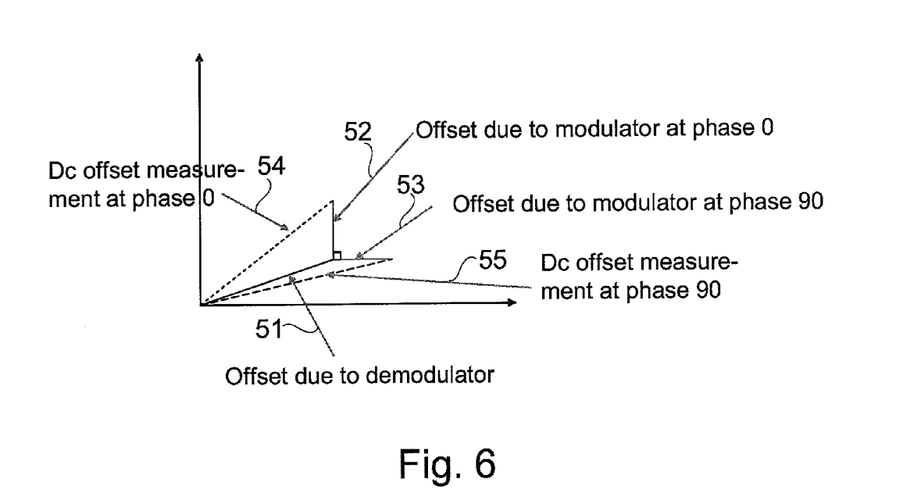
FIG. 6 shows a phasor diagram illustrating the effects of dc offset introduced by a up-converter and a down-converter on a signal following the path shown in FIG. 4.

In a system comprising an IQ up-converter and an IQ down-converter, the dc offset component added by each IQ device must be separately evaluated and compensated for using both pre-correction 12 and post-correction 42 blocks. Identifying impairment contributions from the up-converter and the down-converter is enabled by use of a switchable phase delay (module 41) in the LO signal applied to the down-converter. FIG. 6 shows a phasor diagram which illustrates the dc offset measurements at phase 0 and phase 90. There is an offset 51 due to the demodulator.

The offset due to the modulator is shown by 52, 53 and depends on the phase setting of switch 41. When phase switch is set to 0, the combined effect of the dc offsets 51 and 52 results is shown by 54. When phase switch is set to 90°, the combined effect of the dc offsets 51 and 53 results in shown by 55.

Two estimates of the mean DC level of the signal are made, one with the phase delay switch 41 set to zero, and one with the phase delay switch set to 90°. Each estimate comprises contributions due to the up-converter and the down-converter.

Let dc offset contribution due to the up-converter be dc_mod

Let dc offset contribution due to the down-converter be dc_demod

Let combined dc offset measurement at LO phase shift 0 be Meas_0

Let combined dc offset measurement at LO phase shift 90 be Meas_90

Assume an arbitrary phase shift $\phi$ exists in the path between the up-converter and down-converter. In reality, there is also an arbitrary (but constant) phase difference between the up-converter and down-converter LO inputs. The quantity $\phi$ also accounts for that difference.

$$\text{Meas\_0} = \text{dc\_demod} + \text{dc\_mod} * e^{i*\phi}$$

$$\text{Meas\_90} = \text{dc\_demod} + \text{dc\_mod} * e^{i*(\phi+90)}$$

The equations can be rearranged to give:

$$\text{dc\_demod} = (\text{Meas\_0} * e^{i*90} - \text{Meas\_90})/(e^{i*90} - 1)$$

$$\text{dc\_mod} = (\text{Meas\_0} - \text{Meas\_90})/(e^{i*\phi} - e^{i*(\phi+90)})$$

A dc correction dc_mod is applied by module 12 before the up-converter 14, and a dc correction dc_demod is applied by module 42 after the down-converter 31. Note that the phase shift ($\phi$) that will exist in the loop between the up-converter 14 and down-converter 31 rotates the up-converter dc error as seen at the down-converter output. The $e^{i*\phi}$ term in the above equation for dc_mod corrects for this. Methods to estimate $\phi$ were described earlier.

Figure 7:
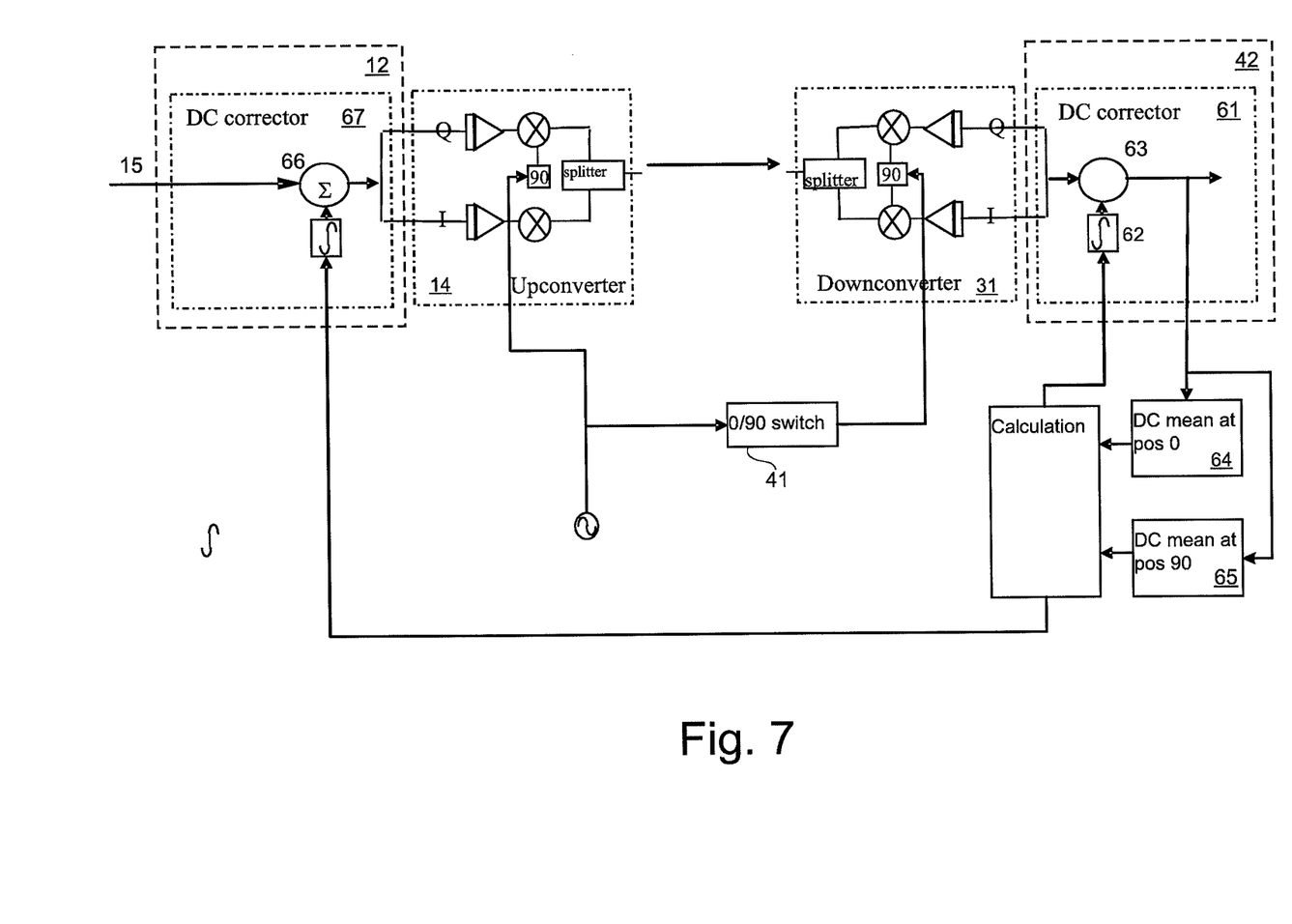
FIG. 7 shows measurement and correction of mean dc level of a received signal.

FIG. 7 schematically shows functions to perform this aspect of the measurement and correction. Blocks 64, 65 calculate the dc mean at the two phase shift values provided by phase switch 41. A calculation unit calculates correction values which are to be applied by a dc corrector 61 within post-correction module 42 and a dc corrector 67 within pre-correction module 12. At corrector 61 the correction signal output by the calculation unit is integrated 62 and summed 63 with the signal output from downconverter 31. A similar process occurs at dc corrector 67, acting on input signal 8.

Gain Correction

In the single IQ case the rms of the real and imaginary parts of the captured signal are derived. The ratio of these two provides a gain offset that is then applied to the signal. The ratio of rms values can be deduced from the diagonal elements of the matrix Y described earlier:

Mean square value in I direction is proportional to Y(1,1)

Mean square value in Q direction is proportional to Y(2,2)

rms(real part)/rms(imag part)=sqrt(Y(1,1)/Y(2,2))

In the dual IQ case the measured ratio of rms deflection in I,Q has contributions from up-converter and down-converter. The ratio is measured for the two states of the LO switch, using a matrix Y calculated for each of the LO states.

Let gain of I relative to Q due to the up-converter be gain_mod

Let gain of I relative to Q due to the down-converter be gain_demod

Let combined measurement of gain of I relative to Q at LO phase shift 0 be Meas_0

Let combined measurement of gain of I relative to Q at LO phase shift 90 be Meas_90

$$\text{Meas\_0} = \text{gain\_demod} * \text{gain\_mod} * f(\phi)$$

$$\text{Meas\_90} = \text{gain\_demod}/\text{gain\_mod} * f(\phi)$$

Where $f(\phi)$ accounts for the phase rotation in up-converter and down-converter path Hence gain_demod=sqrt(Meas_0*Meas_90)

And $f(\phi)$ has cancelled out.

The gain offset of the down-converter is corrected based on this result. The gain offset of the up-converter, as seen at the down-converter output, can also be calculated but this requires correction for the effect of arbitrary phase shift as described in later section on up-converter correction.

Figure 8:
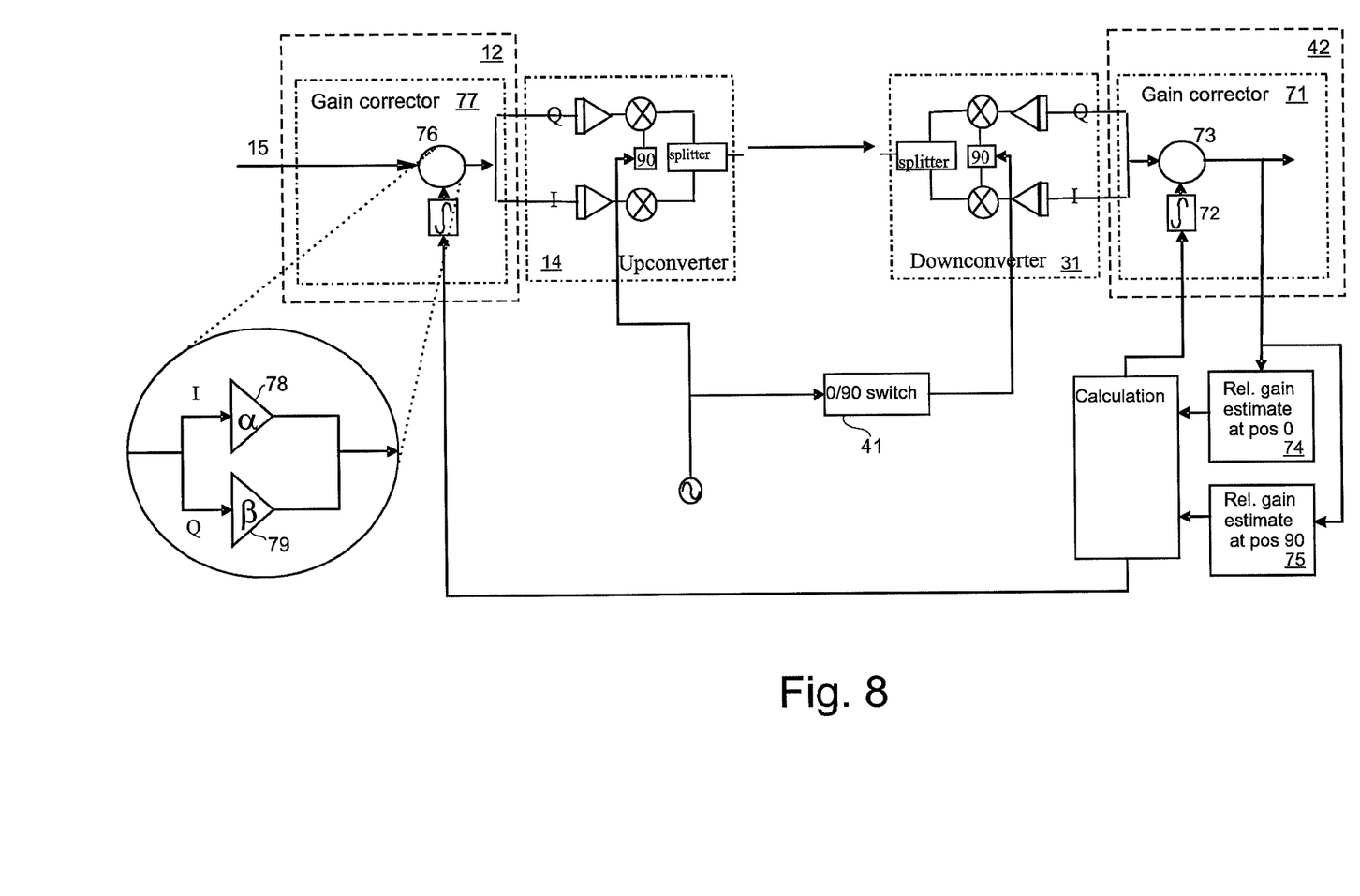
FIG. 8 shows measurement and correction of gain offset error of a received signal.

FIG. 8 schematically shows functions to perform this aspect of the measurement and correction. Blocks 74, 75 calculate the relative gains in the I and Q channels at the two phase shift values provided by phase switch 41. A calculation unit calculates correction values which are to be applied by a gain corrector 71 within post-correction module 42 and a gain corrector 77 within pre-correction module 12. The expanded detail of block 76 shows an amplifier 78 in the I channel and an amplifier 79 in the Q channel. Block 73 has the same structure as block 76. The amplifiers 78, 79 can each apply a different gain to their respective channel to correct for any gain errors.

Angle Correction

In the single IQ case, the cross-correlation of the real and imaginary parts of the signal should be zero. Depending on whether the cross correlation value is positive or negative determines the sign of the angle offset. The cross correlation values can be deduced from the diagonal elements of the matrix Y, specifically Y(1,2) or Y(2,1). The measurement is used to adjust the correction.

The angle correction is of the form:

$$\begin{bmatrix} \cos(\varphi/2) & \sin(\varphi/2) \\ \sin(\varphi/2) & \cos(\varphi/2) \end{bmatrix}$$

The above matrix transforms a point in IQ space to a point in I'Q' space, where the I' axis is rotated by +φ/2 relative to the I axis and the Q' axis is rotated by −φ/2 relative to the Q axis.

In the dual IQ case, the cross-correlation of IQ signals is measured for the two phases of the LO. Here the sum of the two measurements is used to control the correction of the down-converter. The difference of the two measurements can be used to drive the up-converter correction but again the phase delay must be accounted for. This requires correction for the effect of arbitrary phase shift as described in later section on up-converter correction.

Figure 9:
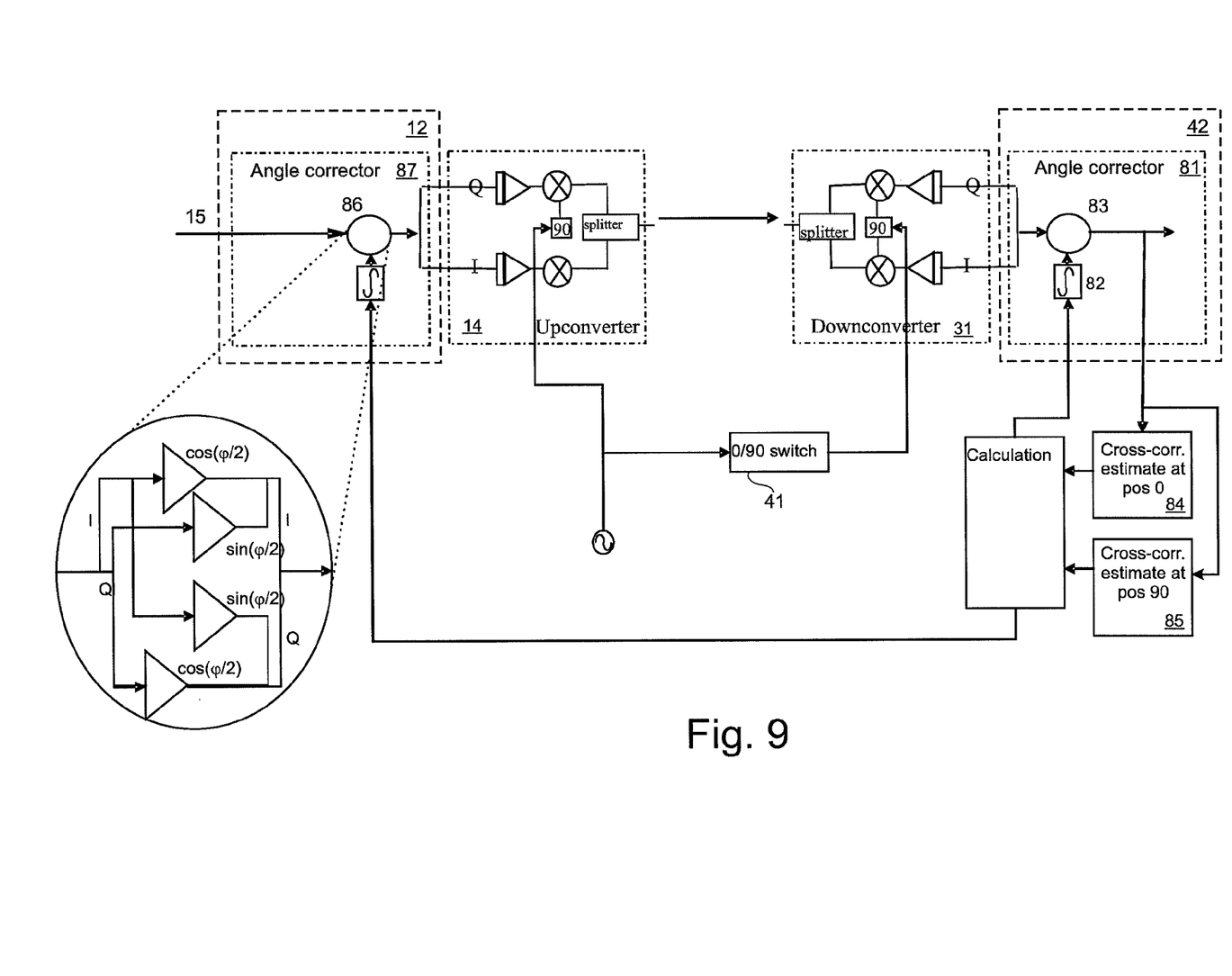
FIG. 9 shows measurement and correction of angle offset error of a received signal.

FIG. 9 schematically shows functions to perform this aspect of the measurement and correction. Blocks 84, 85 calculate an estimate of the cross-correlation at each of the two phase shift values provided by phase switch 41. A calculation unit calculates correction values which are to be applied by an angle corrector 81 within post-correction module 42 and an angle corrector 87 within pre-correction module 12. The expanded detail of block 86 shows blocks to adjust the angle of the I,Q axes. Block 83 has the same structure as block 86.

So far the effects of each impairment have been separately described. Of course, a received signal may have experienced one of these types of impairments, or any combination of impairments, and this will be dictated by the particular deficiencies of the up-converter and down-converter. Information about the separate impairments (dc, gain, angle offset) can be separately derived from captured data. As an example, dc offset averaged over capture length is easily subtracted from all samples before rms signal level is calculated. A typical implementation iteratively estimates the impairments and corrects for them, and correction parameters for all impairments will converge to correct values.

Up-converter Correction

Figure 10:
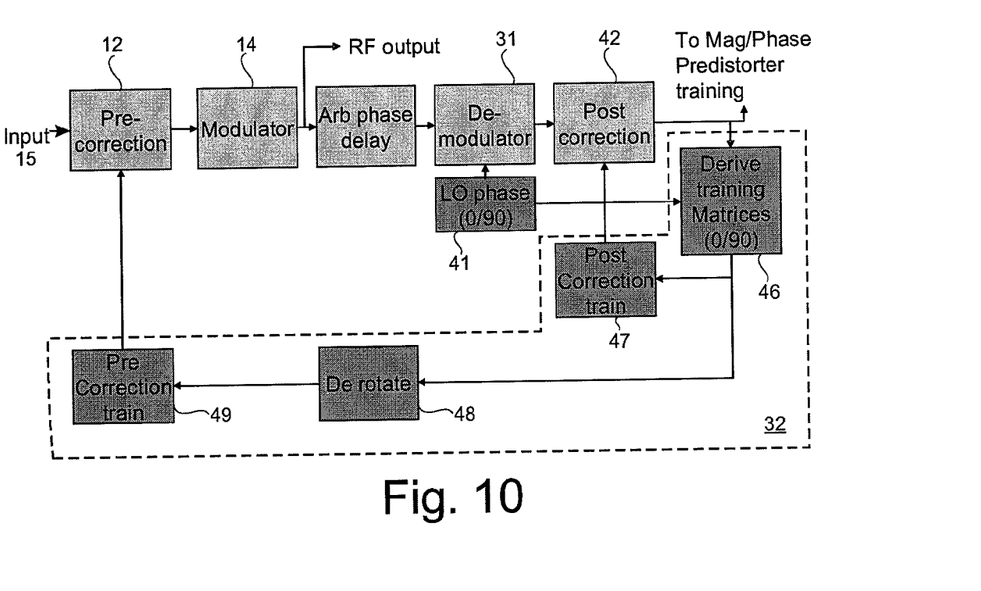
FIG. 10 shows functional blocks of the overall error measuring and correction system. 46

Given the down-converter correction estimates previously calculated, these can be applied to the signal measured at the down-converter output. This should cancel the impairment effect of the down-converter, leaving only the effects of the up-converter impairments and phase rotation. FIG. 10 shows the main functional blocks of the correction system, forming part of the observation receiver 32 of FIG. 1.

The effect of the phase rotation is removed by application of a rotation matrix of the form:

$$R = \begin{bmatrix} \cos(\phi) & -\sin(\phi) \\ \sin(\phi) & \cos(\phi) \end{bmatrix}$$

The above matrix transforms a point in IQ space to a point in I'Q' space, where both the I' and Q' axes are rotated by +φ relative to the I and Q axes If the output of the trained post-corrector 42 is the vector X, then that signal is referred back to the up-converter input 12/14 by R*X. We are interested in the term:

$$(R*X)*(R*X)^T = R*(X*X^T)*R^T$$

The term $X*X^T$ (see earlier) has previously been calculated and can be reused. The rotation angle φ in R is estimated by 45. The above expression is derived by de-rotate block 48.

The output of the post-correction block 42 is the main input to the Mag/Phase Predistorter training system which estimates the predistortion parameters to correct for the RF amplifier imperfections. Any quadrature errors resulting from the up-converter need to be corrected by pre-correction of the digital baseband input signal, since any impairments are visible in the transmitted signal. Similarly, any quadrature errors resulting from the down-converter need to be corrected by post-correction of the digital baseband input signal. If the down-converter impairments are not corrected this will reduce the accuracy of the subsequent amplifier predistortion correction estimates. The training matrices 46 refer to the $Y=XX^T$ first order expansion for rms and cross-correlation described earlier, and the second order expansion described below, captured at both 0 and 90 degree phase shifts of the down-converter LO. Using the training matrices 46, estimates of the post-corrector parameters to correct for the impairments introduced by the down-converter 31 are made and applied to the post corrector 42. After some iterations of the training loop the impairment effects of the down-converter 31 should be substantially corrected. At this point, the training matrices 46 are corrected for the effect of the phase delay by pre- and post-multiplication by a rotation matrix 48:

$$(R*X)*(R*X)^T = R*(X*X^T)*R^T$$

The phase delay is estimated by capture of both input and output signals in the 0 degree LO phase state and estimation of phase rotation.

For the case that the post-corrector 42 is completely converged the two training matrices derived by 46 will be identical. For the case that the post-corrector 42 is not completely converged, the two training matrices derived by 46 will not be identical but the up-converter correction parameters can be derived from the average of the two matrices. Comparison of the two matrices can identify which components result from the up-converter (average) and which result from the down-converter (differences).

Higher Order Correction

It has so far been described how impairments such as dc offset, gain offset and angle offset can be measured and corrected for. These can be corrected by information derived from the first order expansion of the down-converter output signal.

A real IQ signal typically has additional imperfections. These may include different time delays through IQ channels, different frequency response of IQ channels, sample timing offsets of AD and DAC devices between channels. Additional correction blocks to model these impairments can be added to the system and corrected based on the higher order expansion terms.

The first order expansion described above (generating a 2*2 matrix) can be used to derive first order errors. In reality, higher order errors exist. The expansion may be expanded to any order as follows. A second order expansion results in 4*4 matrix and nth order expansion results in a 2n*2n matrix.

We extend the concept by defining X as follows. Each pair of rows is a simple replication of the two rows above, but shifted to the left one place.

$$X = \begin{bmatrix} a_2 & \cdots & a_{n-2} \\ b_2 & \cdots & b_{n-2} \\ a_1 & \cdots & a_{n-1} \\ b_1 & \cdots & b_{n-1} \\ a_0 & \cdots & a_n \\ b_0 & \cdots & b_n \end{bmatrix}$$

$$XX^T = \begin{bmatrix} \sum_i a_{i+2}^2 & \sum_i a_{i+2}b_{i+2} & \sum_i a_{i+2}a_{i+1} & \sum_i a_{i+2}b_{i+1} & \sum_i a_{i+2}a_i & \sum_i a_{i+2}b_i \\ \sum_i a_{i+2}b_{i+2} & \sum_i b_{i+2}^2 & \sum_i a_{i+1}b_{i+2} & \sum_i b_{i+2}b_{i+1} & \sum_i a_ib_{i+2} & \sum_i b_{i+2}b_i \\ & & \sum_i a_{i+1}^2 & \sum_i a_{i+1}b_{i+1} & \sum_i a_{i+1}a_i & \sum_i a_{i+1}b_i \\ & & \sum_i a_{i+1}b_{i+1} & \sum_i b_{i+1}^2 & \sum_i a_ib_{i+1} & \sum_i b_{i+1}b_i \\ & & & & \sum_i a_i^2 & \sum_i a_ib_i \\ & & & & \sum_i a_ib_i & \sum_i b_i^2 \end{bmatrix}$$

25

Or shifting start point by 2

$$XX^T = \begin{bmatrix} \sum_i a_i^2 & \sum_i a_ib_i & \sum_i a_ia_{i-1} & \sum_i a_ib_{i-1} & \sum_i a_ia_{i-2} & \sum_i a_ib_{i-2} \\ \sum_i a_ib_i & \sum_i b_i^2 & \sum_i a_{i-1}b_i & \sum_i b_ib_{i-1} & \sum_i a_{i-2}b_i & \sum_i b_ib_{i-2} \\ \sum_i a_ia_{i-1} & \sum_i a_{i-1}b_i & \sum_i a_{i-1}^2 & \sum_i a_{i-1}b_{i-1} & \sum_i a_{i-1}a_{i-2} & \sum_i a_{i-1}b_{i-2} \\ \sum_i a_ib_{i-1} & \sum_i b_ib_{i-1} & \sum_i a_{i-1}b_{i-1} & \sum_i b_{i-1}^2 & \sum_i a_{i-2}b_{i-1} & \sum_i b_{i-1}b_{i-2} \\ \sum_i a_ia_{i-2} & \sum_i a_{i-2}b_i & \sum_i a_{i-1}a_{i-2} & \sum_i a_{i-2}b_{i-1} & \sum_i a_{i-2}^2 & \sum_i a_{i-2}b_{i-2} \\ \sum_i a_ib_{i-2} & \sum_i b_ib_{i-2} & \sum_i a_{i-1}b_{i-2} & \sum_i b_{i-1}b_{i-2} & \sum_i a_{i-2}b_{i-2} & \sum_i b_{i-2}^2 \end{bmatrix}$$

The expansion is shown for a good IQ signal below, expanded to include the $a_i a_{i-4}$ terms. By a good signal we mean a digitally generated signal with no IQ impairments.

| 2.0167 | 0.0000 | 1.8772 | 0.3338 | 1.4926 | 0.5482 | 0.9549 | 0.5569 | 0.3899 | 0.3310 |
|---|---|---|---|---|---|---|---|---|---|
| 0.0000 | 2.0167 | −0.3338 | 1.8772 | −0.5482 | 1.4926 | −0.5569 | 0.9549 | −0.3310 | 0.3899 |
| 1.8772 | −0.3338 | 2.0167 | 0.0000 | 1.8772 | 0.3338 | 1.4926 | 0.5482 | 0.9549 | 0.5569 |
| 0.3338 | 1.8772 | 0.0000 | 2.0167 | −0.3338 | 1.8772 | −0.5482 | 1.4926 | −0.5569 | 0.9549 |
| 1.4926 | −0.5482 | 1.8772 | −0.3338 | 2.0167 | 0.0000 | 1.8772 | 0.3338 | 1.4926 | 0.5482 |
| 0.5482 | 1.4926 | 0.3338 | 1.8772 | 0.0000 | 2.0167 | 0.3338 | 1.8772 | −0.5482 | 1.4926 |
| 0.9549 | −0.5569 | 1.4926 | −0.5482 | 1.8772 | −0.3338 | 2.0167 | 0.0000 | 1.8772 | 0.3338 |
| 0.5569 | 0.9549 | 0.5482 | 1.4926 | 0.3338 | 1.8772 | 0.0000 | 2.0167 | −0.3338 | 1.8772 |
| 0.3899 | −0.3310 | 0.9549 | −0.5569 | 1.4926 | −0.5482 | 1.8772 | −0.3338 | 2.0167 | 0.0000 |
| 0.3310 | 0.3899 | 0.5569 | 0.9549 | 0.5482 | 1.4926 | 0.3338 | 1.8772 | 0.0000 | 2.0167 |

It can be seen that the matrix for a good signal is symmetrical, and (at least for sums over many samples), each 2*2 sub matrix in the top row and left column is repeated in a diagonally downward direction. For each 2*2 sub-matrix, the leading diagonal elements are equal, and the sum of the trailing diagonal elements is zero. For the case of the 2*2 sub matrices on the leading diagonal of the overall matrix, the trailing diagonal elements are zero. It is easily shown that for a signal containing deliberate quadrature impairments that the above relationships do not hold true. The expansion to higher order terms may be used to drive higher order correction blocks.

Alternative Mathematical Approach Based on Schur Decomposition

The quadrature error can be removed from the signal by forcing the rms of the real and imaginary parts to be equal in values, and the cross-correlation to zero. If we can identify correction matrix G such that $GX(GX)^T$ is a diagonal matrix with equal elements on leading diagonal, then we should remove the IQ errors. The matrix G is then the pre-corrector.

The schur decomposition can be used to derive the matrix G. The matrix G can be seen as a rotation (to rotate an elliptical signal so that minor/major axes align to IQ directions) followed by multiplication by diagonal matrix (applies separate independent gains along I,Q axes).

This provides a mathematical correction means less directly tied to the physical concepts of gain and amplitude error.

The invention is not limited to the embodiments described herein, which may be modified or varied without departing from the scope of the invention.

We claim:

1. A transmit chain comprising:
   a transmit path comprising:
      a pre-correction module for receiving an input signal and applying a correction to the input signal to correct for errors introduced in the transmit path and outputting pre-corrected quadrature signal components;
      a quadrature up-converter for up-converting the pre-corrected quadrature signal components;
   an observation path comprising:
      a coupler for receiving a portion of the up-converted quadrature signal components and outputting a coupled signal;
      a quadrature down-converter for down-converting the coupled signal to baseband quadrature signal components;
   a post-correction module for applying distortion to the baseband quadrature signal components to correct for errors introduced by the observation path;
   the transmit chain further comprising:
      a local oscillator signal source which is arranged to provide the quadrature up-converter and the quadrature down-converter with a local oscillator signal and wherein the local oscillator signal source is operable in:
         a first state in which the local oscillator signal is applied to the quadrature up-converter and the quadrature down-converter; and
         a second state in which the local oscillator signal is applied to the quadrature up-converter and the quadrature down-converter and a phase shift is made to the local oscillator signal applied to quadrature up-converter or the quadrature down-converter compared to the first state;
      a processor arranged to:
         monitor properties of the baseband quadrature signal components while the local oscillator signal source is operating in the first state and while the local oscillator signal source is operating in the second state;
         determine a correction to apply to the baseband quadrature signal components at the post-correction module, based on the monitored properties of the quadrature down-converted signal components, to correct for errors introduced by the observation path;
         determine a correction to apply to the input signal at the pre-correction module, based on the monitored properties of the quadrature down-converted signal components, to correct for errors introduced in the transmit path.

2. The transmit chain according to claim 1, wherein the local oscillator signal source is operable, in the second state, to make the phase shift only to the local oscillator signal applied to the quadrature down-converter.

3. The transmit chain according to claim 1, wherein the transmit path further comprises an amplifier and the processor is arranged to calculate predistortion parameters to correct non-linearities of the amplifier based on a comparison of a signal output from the post-correction module and the input signal.

4. The transmit chain according to claim 1, wherein the processor is arranged to determine and correct at least one of:
   a dc offset;
   a gain offset;
   an angle offset;
based on the monitored properties of the baseband quadrature signal components.

5. The transmit chain according to claim 4, wherein the processor is arranged to determine a dc offset correction function for the quadrature down-converter as a function of a mean dc level of the baseband quadrature signal components measured at the first state and the second state.

6. The transmit chain according to claim 4, wherein the processor is arranged to determine a gain correction function for the quadrature down-converter as a function of a ratio of average in-phase and quadrature signal powers for the baseband quadrature signal components at each of the first state and the second state.

7. The transmit chain according to claim 4, wherein the processor is arranged to determine an angle correction function for the quadrature down-converter as a function of a cross-correlation of in-phase and quadrature signal components at each of the first state and second state.

8. The transmit chain according to claim 1, wherein the processor is arranged, in each state, to:
   form a first matrix of real and imaginary parts of complex values representing samples of the baseband quadrature signal components;
   transpose the first matrix to form a second matrix;
   multiply the first matrix and second matrix to form a third matrix, wherein elements of the third matrix, obtained for each state of the local oscillator, comprises power and cross-correlation computations of the real and imaginary parts of the signal samples.

9. The transmit chain according to claim 1, wherein the processor is arranged to:
   form a matrix $X_0$ of complex values representing samples of the baseband quadrature signal components captured for the local oscillator in the first state;
   calculate a correction matrix $G_0$ such that $G_0 X_0 (G_0 X_0)^T$ is a diagonal matrix with equal elements on leading diagonal;
   repeat the above to form a matrix $X_{90}$ captured for the local oscillator in the second state and a correction matrix $G_{90}$;
   use elements of the matrix $G_0$ and $G_{90}$ to derive parameters for the pre-correction module and post-correction module.

10. The transmit chain according to claim 1, wherein the processor is arranged to: form a matrix $X_0$ of real and imaginary parts of complex values representing samples of the baseband quadrature signal components;
   calculate at least a second order expansion of the matrix $Y_0$;
   repeat the above to form a matrix $X_{90}$ captured for the local oscillator in the second state and a second order expansion of that matrix $Y_{90}$;
   use elements of the second order expansion matrices to determine a correction for at least one of: the post-correction module; the pre-correction module.

11. The transmit chain according to claim 1, wherein the processor is arranged to determine a phase delay in a loop comprising the transmit path and the observation path and to use the determined phase delay and baseband quadrature signal components in the two local oscillator states to determine the error contributed by the transmit path.

12. The transmit chain according to claim 1, wherein the phase shift in the second state is 90 degrees.

13. The transmit chain according to claim 1, wherein the observation path is shared by a plurality of transmit paths on a time-shared basis.

14. The transmit chain according to claim 1, wherein the quadrature up-converter is arranged to up-convert the pre-corrected quadrature signal components from baseband to RF and the quadrature down-converter is arranged to down-convert the coupled signal from RF to quadrature signal components at baseband.

15. A wireless communications apparatus comprising the transmit chain according to claim 1.

16. The wireless communications apparatus according to claim 15, in the form of one of: a wireless terminal; a wireless base station.

17. A method of processing a signal in a transmit chain comprising:
    up-converting quadrature components of an input signal using a quadrature up-converter in a transmit path;
    sampling a portion of the up-converted quadrature components to provide an observation signal;
    down-converting the observation signal to baseband using a quadrature down-converter in an observation path;
    using a local oscillator signal source to provide the quadrature up-converter and the quadrature down-converter with a local oscillator signal, the local oscillator signal source being operable in:
        a first state in which the local oscillator signal is applied to the up-converter and the down-converter; and
        a second state in which the local oscillator signal is applied to the quadrature up-converter and the quadrature down-converter and a phase shift is made to the signal applied to the quadrature up-converter or the quadrature down-converter compared to the first state;
    monitoring properties of the down-converted observation signal while the local oscillator signal source is operating in the first state and while the local oscillator signal source is operating in the second state;
    determining a correction to apply to the down-converted observation signal, based on the monitored properties of the down-converted observation signal, to correct for errors introduced by the observation path and applying the correction to the down-converted observation signal;
    determining a correction to apply to the input signal, based on the monitored properties of the down-converted observation signal, and applying the correction to the input signal to correct for errors introduced in the transmit path.

18. A processor for use in a transmit chain comprising a transmit path comprising a quadrature up-converter for up-converting quadrature signal components of an input signal to produce an output signal, an observation path comprising a quadrature down-converter for down-converting a portion of the output signal to baseband quadrature signal components and a local oscillator signal source which is arranged to provide the up-converter and the down-converter with a local oscillator signal, the processor being arranged to:
    cause the local oscillator signal source to operate in:
        a first state in which the local oscillator signal is applied to the quadrature up-converter and the quadrature down-converter and;
        a second state in which the local oscillator signal is applied to the quadrature up-converter and the quadrature down-converter and a phase shift is made to the signal applied to up-converter or the down-converter compared to the first state;
    monitor properties of the baseband quadrature signal components while the local oscillator signal source is operating in the first state and while the local oscillator signal source is operating in the second state;
    calculate a correction to apply to the baseband quadrature signal components, based on the monitored properties of the baseband quadrature signal components, to correct for errors introduced by the observation path;
    calculate a correction to apply to the input signal, based on the monitored properties of the baseband quadrature signal components, to correct for errors introduced in the transmit path.

19. The processor according to claim 18, which is arranged to determine and correct at least one of:
    a dc offset;
    a gain offset;
    an angle offset;
based on monitored properties of the baseband quadrature signal components.

20. The processor according to claim 19, which is arranged to determine a dc offset correction function for the quadrature down-converter as a function of a mean dc level of the baseband quadrature signal components measured at the first state and the second state.

21. The processor according to claim 19, which is arranged to determine a gain correction function for the quadrature down-converter as a function of a ratio of average in-phase and quadrature signal powers for the baseband quadrature signal components at each of the first state and the second state.

22. The processor according to claim 19, wherein the processor is arranged to determine an angle correction function for the quadrature down-converter as a function of a cross-correlation of in-phase and quadrature signal components at each of the first state and second state.

23. The processor according to claim 18, wherein the local oscillator signal source is operable, in the second state, to make the phase shift only to the local oscillator signal applied to the down-converter.

24. A method of correcting signal errors in a transmit chain comprising a transmit path comprising a quadrature up-converter for up-converting quadrature signal components of an input signal to produce an output signal, an observation path comprising a quadrature down-converter for down-converting a portion of the output signal to baseband quadrature signal components and a local oscillator signal source which is arranged to provide the up-converter and the down-converter with a local oscillator signal, the method comprising:
    causing the local oscillator signal source to operate in:
        a first state in which the local oscillator signal is applied to the quadrature up-converter and quadrature the down-converter; and
        a second state in which the local oscillator signal is applied to the quadrature up-converter and the quadrature down-converter and a phase shift is made to the signal applied to up-converter or the down-converter compared to the first state;
    monitoring properties of the baseband quadrature signal components while the local oscillator signal source is operating in the first state and while the local oscillator signal source is operating in the second state;
    determining a correction to apply to the baseband quadrature signal components at the post-correction module, based on the monitored properties of the quadrature down-converted signal components, to correct for errors introduced by the observation path;
    determining a correction to apply to the input signal at the pre-correction module, based on the monitored properties of the quadrature down-converted signal components, to correct for errors introduced in the transmit path.

25. A non-transitory, computer accessible memory medium storing program instructions for correcting signal errors in a transmit chain comprising a transmit path comprising a quadrature up-converter for up-converting quadrature signal components of an input signal to produce an output signal, an observation path comprising a quadrature down-converter for down-converting a portion of the output signal to baseband quadrature signal components, and a local oscillator signal source which is arranged to provide the up-converter and the down-converter with a local oscillator signal, wherein the program instructions are executable by a processor to:

cause the local oscillator signal source to operate in:
a first state in which the local oscillator signal is applied to the quadrature up-converter and the quadrature down-converter; and
a second state in which the local oscillator signal is applied to the quadrature up-converter and the quadrature down-converter and a phase shift is made to the signal applied to up-converter or the down-converter compared to the first state;

monitor properties of the baseband quadrature signal components while the local oscillator signal source is operating in the first state and while the local oscillator signal source is operating in the second state;

determine a correction to apply to the baseband quadrature signal components at the post-correction module, based on the monitored properties of the quadrature down-converted signal components, to correct for errors introduced by the observation path;

determine a correction to apply to the input signal at the pre-correction module, based on the monitored properties of the quadrature down-converted signal components, to correct for errors introduced in the transmit path.

* * * * *